United States Patent
Hoffmann (10) Patent No.: US 7,646,840 B2
(45) Date of Patent: Jan. 12, 2010

(54) CLOCK RECOVERY CIRCUIT AND A MEMORY DEVICE EMPLOYING THE SAME

(75) Inventor: Jochen Hoffmann, Colchester, VT (US)

(73) Assignee: Infineon Technologies AG, Munich (DE)

( * ) Notice: Subject to any disclaimer, the term of this patent is extended or adjusted under 35 U.S.C. 154(b) by 748 days.

(21) Appl. No.: 11/297,553

(22) Filed: Dec. 8, 2005

(65) Prior Publication Data

US 2007/0133338 A1 Jun. 14, 2007

(51) Int. Cl.
*H03D 3/24* (2006.01)
(52) U.S. Cl. .................................................. 375/376
(58) Field of Classification Search ................. 375/215, 375/294, 327, 376; 342/103; 370/503; 365/233.18
See application file for complete search history.

(56) References Cited

U.S. PATENT DOCUMENTS

| 6,373,289 | B1 | 4/2002 | Martin et al. |
| 6,437,601 | B1 | 8/2002 | Borkar et al. |
| 6,442,225 | B1 * | 8/2002 | Huang ......................... 375/376 |
| 6,725,390 | B1 | 4/2004 | Liu et al. |
| 2004/0153681 | A1 * | 8/2004 | Cao ............................ 713/400 |
| 2004/0222828 | A1 | 11/2004 | Ishikawa |
| 2006/0250192 | A1 * | 11/2006 | Hsieh ........................... 331/16 |

* cited by examiner

*Primary Examiner*—Sam K Ahn
(74) *Attorney, Agent, or Firm*—Slater & Matsil, L.L.P.

(57) ABSTRACT

A method of inputting data to an integrated circuit is disclosed. A plurality of data signals are serially received from a source external to the integrated circuit. A strobe signal is derived from the plurality of data signals. The deriving is done by circuitry within the integrated circuit. The data signals can be latched at an input of the integrated circuit using the strobe signal that was derived within the integrated circuit.

10 Claims, 8 Drawing Sheets

CLOCK RECOVERY CIRCUIT AND A MEMORY DEVICE EMPLOYING THE SAME

TECHNICAL FIELD

The present invention is directed, in general, to clock synchronization systems for electronic devices and, more specifically, to a clock recovery circuit, method of providing a strobe signal for an electronic device, and a memory device employing the same.

BACKGROUND

When communicating information such as data content, memory addresses, and control bits from one integrated circuit or "chip" of an electronic device to another, it is necessary to ensure that each data buffer within the integrated circuit captures the transmitted data. In view of the trend for integrated circuits of electronic devices to process and transmit several hundred megabits per second or higher at faster rates, and because of delays and other impairments experienced by the signals carrying the data, it is becoming more difficult to synchronize a transmission of the data between the integrated circuits of the electronic device. With respect to memory devices such as a dynamic random access memory (DRAM), the problem can be exacerbated as a distance between data pins of the chips embodying the memory device (i.e., the memory chips) may be relatively long in comparison to other systems such as microprocessors.

A potential solution to the aforementioned limitation is to employ a different package design for the memory chips. Following the current packaging designs using bonding wires, pads for the memory chips are generally located in one or two rows of the package. Other systems embodied in integrated circuits such as microprocessors, as an example, are not limited in this aspect. The data pads may be located adjacent to one another with additional rows for the ground and virtual device driver pads surrounding the data bus on additional rows. Inasmuch as the above referenced packaging designs are significantly more expensive, however, the use of the designs is limited in a commodity market segment such as memory devices, especially when viable alternatives are available.

Another widely accepted alternative to synchronize the transmission of the data between the integrated circuits of an electronic device is to incorporate a clock recovery circuit therein. One approach incorporates a phase lock loop (PLL) into the clock recovery circuit to generate a PLL clock signal. The PLL clock signal is compared in phase to a system clock signal of the electronic device and the phase lock loop is adjusted until the two clock signals match. The use of appropriate filtering allows the PLL clock signal to match an "averaged" system clock signal (i.e., a clock signal wherein a random jitter has been filtered/averaged out). When the PLL clock signal and system clock signal are synchronized, a data latch of the respective integrated circuit of the electronic device can then transmit the received data for further processing within the electronic device. While the presently available clock recovery circuits including phase lock loops and other circuits have been adequate to date, the applications are becoming more limited in view of the higher quantity and rate at which the data is transmitted in the electronic device.

Looking at an architecture of a memory device, for instance, high speed data buses thereof frequently employ strobe signals to properly time a latching of the data associated with a data buffer of the integrated circuits of the memory device. As an example, a double data rate DRAM transmits strobe signals in phase with the data transmitted within the DRAM. The strobe signals typically employ the same drivers, data buffers and interfaces as the data in an attempt to synchronize the strobe signal to the data. Within the DRAM, the strobe signals are delayed to match a center of a data eye (e.g., 90 degrees, if the data is transmitted with both edges of a system clock) and then used as a clock to latch the received data. A system clock is usually employed to read out the data from a data latch of the respective integrated circuits of the DRAM and process the data therefrom.

To reduce a pin count associated with the memory chip, one strobe (or a differential strobe pair) is typically used for a multiple of data pins. With an increase in a frequency of the system clock, however, a distribution of the strobe signal to accommodate a delay between multiple data buffers in the memory device may be problematic. For instance, the integrated circuits of the memory device may experience timing complexities when the delay trends toward about half a bit cell. If a propagation delay of the clock signals across the data ports of the integrated circuits of the memory device approach a clock cycle time, implementation of balanced clock trees may be necessary for the strobe signal as well as for the system clock. In an attempt to maintain the strobe signals centered in a bit cell at a data buffer, the data bits may be delayed using dummy delays that model a strobe tree. The use of such additional circuits such as a balanced clock tree, however, adds to the complexity of the design of the memory device.

Accordingly, what is needed in the art is system and method for use with an electronic device that synchronizes a transmission of data therein in view of the escalating demands to transmit a higher quantity of data at a faster rate. More particularly, what is needed is a clock recovery circuit for an electronic device such as a memory device that latches the received data in synchronism with a system clock of the memory device that overcomes the deficiencies of the prior art.

SUMMARY OF THE INVENTION

These and other problems are generally solved or circumvented, and technical advantages are generally achieved, by advantageous embodiments of the present invention, which include a clock recovery circuit for use with an electronic device.

In one embodiment, a method of inputting data to an integrated circuit is disclosed. A plurality of data signals are serially received from a source external to the integrated circuit. A strobe signal is derived from the plurality of data signals. The deriving is done by circuitry within the integrated circuit. The data signals can be latched at an input of the integrated circuit using the strobe signal that was derived within the integrated circuit.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, a clock recovery circuit, method of providing a strobe signal for an electronic device, and a memory device employing the same. The principles of the present invention, however, may also be applied to other electronic devices exhibiting analogous characteristics to the memory device disclosed herein. The advantages associated with the clock recovery circuit and resulting memory device further exploit the benefits associated with the application of such memory devices in electronic systems such as personal computers.

Figure 1:
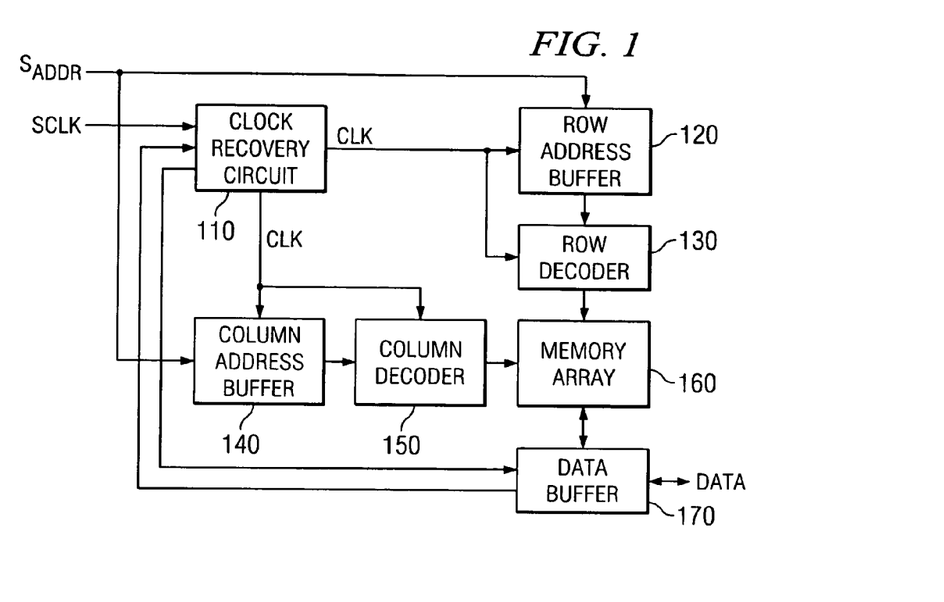
FIG. 1 illustrates a block diagram of an embodiment of an electronic device constructed according to the principles of the present invention.

Referring initially to FIG. 1, a block diagram illustrates an embodiment of an electronic device constructed according to principles of the present invention. In the illustrated embodiment, the electronic device is a memory device and, more particularly, a dynamic random access memory (DRAM). Of course, other electronic devices including other memory devices that experience synchronization challenges within and between the integrated circuits therein may benefit from the clock recovery principles disclosed herein and are well within the broad scope of the present invention. For example, the memory can be a static RAM (SRAM) or a non-volatile memory such as flash memory or EEPROM. Logic devices such as processors, controllers and communications chips could also utilize concepts of the present invention.

The memory of FIG. 1 includes a clock recovery circuit 110 that receives a system clock signal SCLK generated by, for instance, a memory controller of the system that includes the DRAM. Clock recovery circuit 110 provides clock signals CLK to a row address buffer 120, a row decoder 130, a column address buffer 140, a column decoder 150 and data buffer 170 of the DRAM. For sake of simplicity, each of the internal clock signals is indicated as CLK. It is understood, however, that some clock signals may be out of phase from one another or selectively disabled at different times as other internal clock signals. In other words, the clock signals CLK are illustrated to show that a number of clock signals, which may operate continuously or only when needed, may be derived from the system clock.

The memory device also includes a memory array 160 and a data buffer 170. In the case of a DRAM, the memory array includes rows and columns of memory cells, each of which includes a capacitor coupled in series with an access transistor. To access a particular memory cell in the memory array 160, an address signal $S_{ADDR}$ is transmitted to the row address buffer 120 and the column address buffer 140. The column address and the row address of the DRAM typically share external pins so that the row address is received prior to the column address.

The row and column address buffers 120, 140 are adapted to buffer the address signal $S_{ADDR}$ provided, typically, from the memory controller of the memory module. The outputs of the row and column address buffers 120, 140 are coupled to the row and column decoders 130, 150, respectively. The row and column decoders 130, 150 are adapted to decode the address signal $S_{ADDR}$ from the row and column address buffers 120, 140, respectively, to provide signals to the memory array 160, such that, particular rows and columns can be selected. While the row and column decoders 130, 150 are each illustrated as a single functional unit, it should be understood that the row and column decoders 130, 150 are often embodied in multiple levels of pre-decoding and decoding subsystems, some or none of which are synchronously clocked.

Data located in the memory array 160 is written thereto or read therefrom via the data buffer 170. The data buffer 170 and accompanying paths are provided to represent the read and write paths, which may include a larger number of elements and paths (e.g., sense amplifiers and latches). The data buffer 170 can be coupled to an external node to receive the data signals from a source located on another integrated circuit, e.g., a circuit formed on a separate semiconductor substrate.

Clock signals CLK are provided to many components of the DRAM so that the operation of the DRAM can be synchronous. With the advent of higher speed networks and electronic devices in general, clock recovery circuits have become a major focus to increase a bandwidth and speed thereof. The theory behind the clock recovery circuits is that even a very noisy system clock signal can be employed because the behavior of the signal is predictable. As mentioned above, a phase lock loop (PLL) or delay lock loop (DLL) is often employed in the clock recovery circuit to generate a PLL clock signal. The PLL clock signal is compared in phase to the system clock signal and the phase locked loop is adjusted until the two clock signals match. The use of appropriate filtering allows the PLL clock signal to match an "averaged" system clock signal (i.e., a clock signal wherein a random jitter has been filtered/averaged out).

As will become more apparent by the discussions provided herein, a similar circuit can be used even if the received signal is not a clock signal, but a data channel or a clock signal with some edges missing due to jitter or noise. In either case, the expected patterns are inherently not predictable. In such a case, a phase detector may ignore time slots in which the incoming signal does not experience a transition (either because a clock pulse is lost or because a data polarity doesn't change). On time slots that experience a transition on the incoming signal, however, a phase of the incoming signal may be compared to a phase of the PLL clock signal. Adjustments may then be made to the PLL clock signal based thereon.

The aforementioned principles may serve as a starting point for a definition of a high-speed data interface without separate strobe signals. Instead, a phase of the data stream can be detected out of the incoming data by using a system clock of the electronic device that is moved along the data path until the phases match. Then, the system clock is delayed by another half a bit cell and the resulting signal is used as a strobe signal as a latch pulse.

The above described clock recovery techniques can be performed on an individual pin basis. If one latch pulse is generated by comparing a system clock with the incoming data on one pin and the pulse is then distributed across the data port, analogous problems regarding propagation delay may resurface. In view thereof, it may be preferable to group smaller clusters of the pins. As an example, if 16 data pins are present, the clock recovery circuit may generate four local strobe signals and distribute the signals across four pads each.

One major drawback of generating pin individual strobe signals is that power consumption for a phase lock loop, phase detector and trim circuit may be noticeable. The phase lock loop, however, is really only needed if a clock signal needs to be generated locally. For a DRAM, this is generally not the case because there are two clock signals, namely, the system clock signal and the strobe signal, which are toggling at about the same frequency. While the strobe signal is really only needed for the initial latching of incoming data, the system clock signal is used to process the data throughout the DRAM. Consequently, the system clock may be distributed across the data ports, potentially in conjunction with a balanced tree. The system clock can, therefore, be used to locally generate the strobe signal with much less overhead and current consumption.

It should be understood by those skilled in the art that the strobe signal performs a functionality of a clock and typically does not carry additional information (i.e., when a data burst begins). This may not be the case for some electronic devices such as double data rate DRAMs. The strobe signal for such devices may be employed to latch the data and decode the data when a data burst starts and ends. With rising frequencies, however, this process becomes more complicated to implement because, when the data burst begins, the transmission of the data cannot be delayed in accordance with decoding the data with the strobe signal. Thus, it is highly likely that a continuously toggling strobe signal will be hereinafter be employed, even with electronic devices such as double data rate DRAMs.

Figure 2:
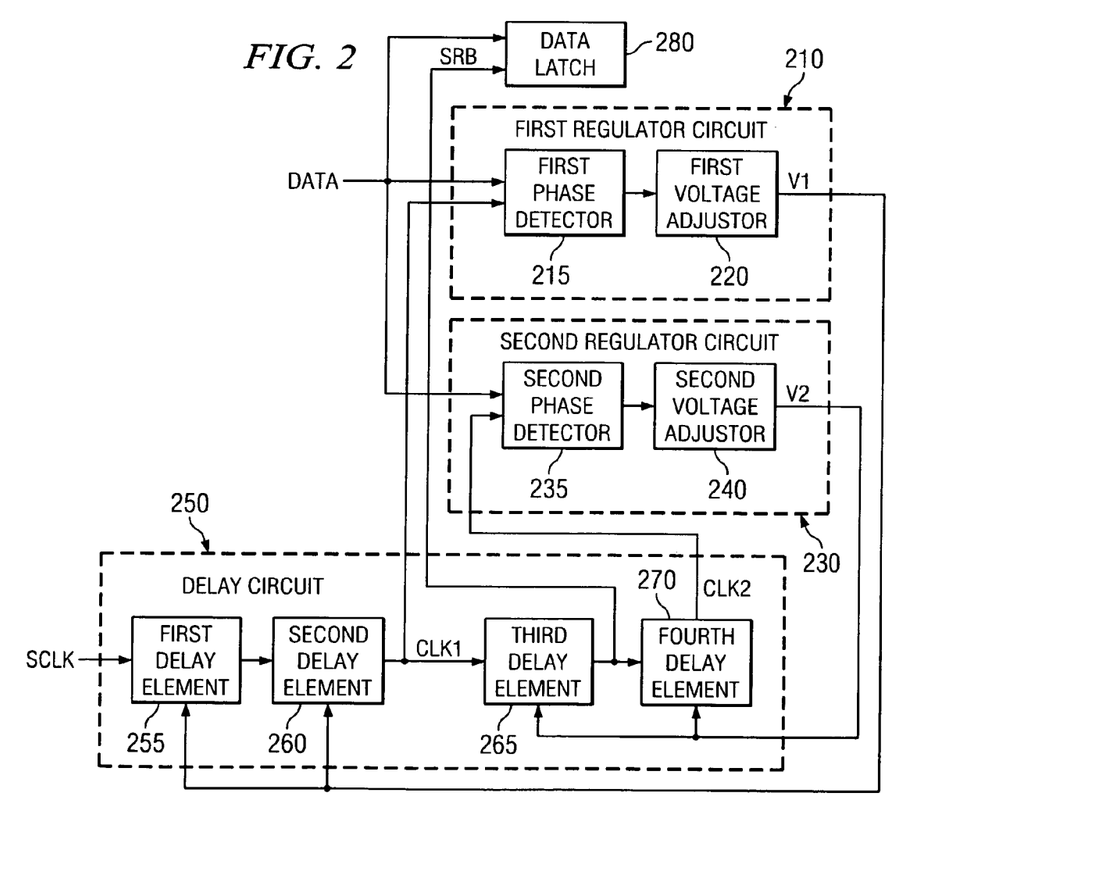
FIG. 2 illustrates a block diagram of an embodiment of a clock recovery circuit constructed according to the principles of the present invention.

Turning now to FIG. 2, a block diagram illustrates an embodiment of a clock recovery circuit constructed according to principles of the present invention. The clock recovery circuit includes a first regulator circuit 210 that compares a first clock signal CLK1 derivable from a system clock (that provides a system clock signal SCLK2) of an electronic device to a data stream from, for instance, a data buffer of the electronic device (see FIG. 1) and provides an intermediate signal (e.g., a first intermediate voltage signal V1) therefrom. The clock recovery circuit 110 also includes a second regulator circuit 230 that compares a second clock signal CLK2 derivable from the system clock to the data stream from the data buffer associated with the electronic device and provides another intermediate signal (e.g., a second intermediate voltage signal V2) therefrom.

The clock recovery circuit 110 also includes a delay circuit 250 having a plurality of delay elements, namely, a first delay element 255, a second delay element 260, a third delay element 265 and a fourth delay element 270. (The first and second delay elements 255 and 260 could be implemented as a single delay element as shown in the particular embodiment of FIG. 3.) The first and second delay elements 255, 260 condition the system clock signal SCLK to derive the first clock signal CLK1. Analogously, the third and fourth delay elements 265, 270 further condition the system clock signal SCLK to derive the second clock signal CLK2.

Figure 3A:
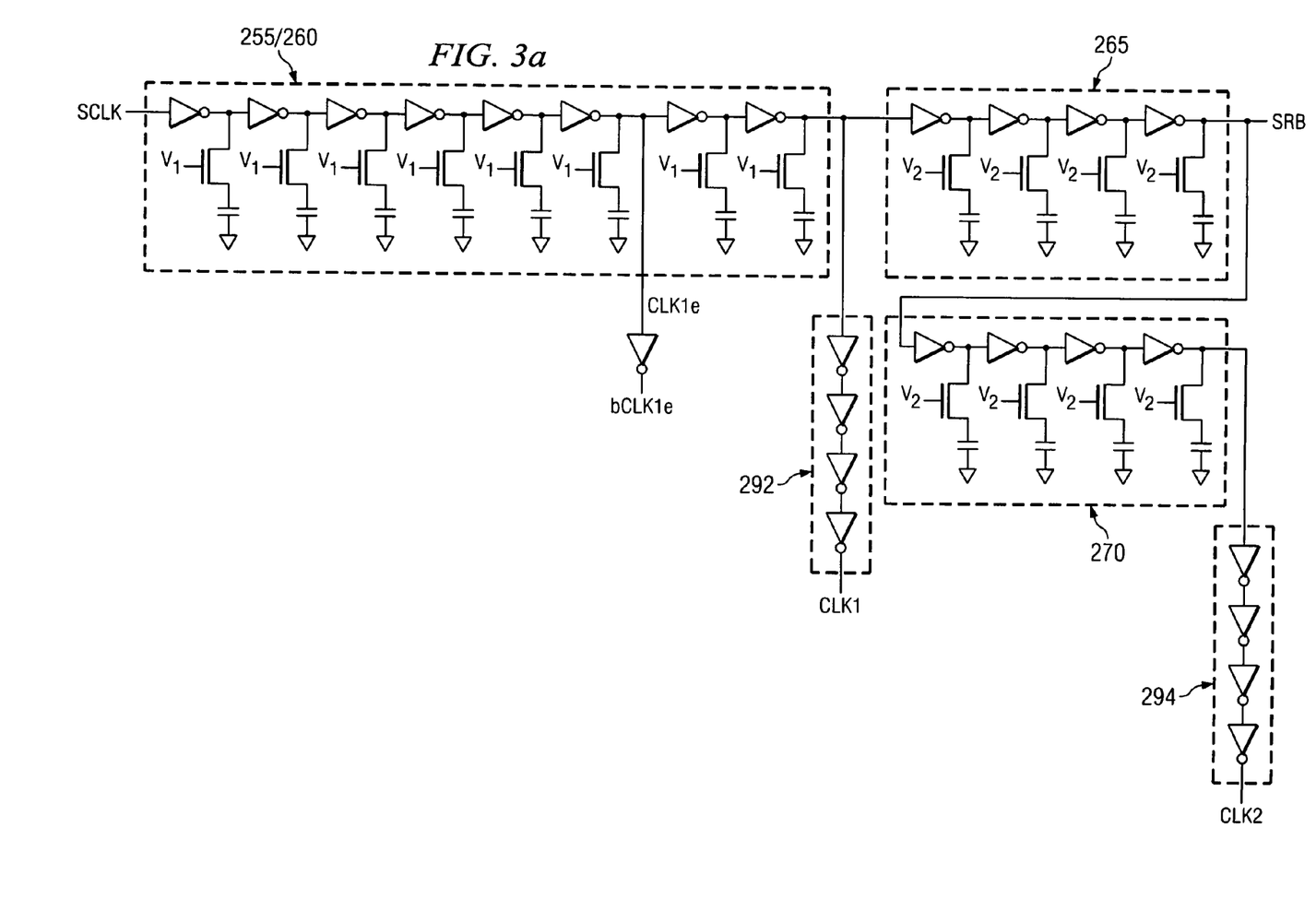
FIGS. 3a and 3b illustrate a schematic diagram for one particular embodiment clock recovery circuit.

The delay elements 255, 260, 265 and 270 are all variable delays and can be implemented in a variety of ways. FIG. 3a illustrates one specific analog embodiment. Alternate embodiments are also envisioned. For example, the delay elements can be implemented with a tapped delay line and multiplexer, as a digital example. Other examples are also possible.

The first regulator circuit 210 includes a first phase detector 215 and a first voltage adjustor 220. The first phase detector 215 has a comparator window with a width equaling one bit cell, that detects a phase relationship between the first clock signal CLK1 and the data stream and provides a phase relationship signal therefrom. The first phase detector 215 typically disregards cycles in which no data transitions occur and otherwise performs the phase comparison as described above. The first voltage adjustor 220 adjusts the first intermediate voltage signal V1 as a function of the phase relationship signal derived from the first phase detector 215. The first intermediate voltage signal V1 controls a delay of the delay circuit 250 and adjustments are made reducing a skew between the first clock signal CLK1 and the data stream. The adjustments are made continuously during an operation of the DRAM to account for any drift that may happen over time due to temperature variations on the dies of the integrated circuits embodying the DRAM.

The third and fourth delay elements 265, 270 of the delay circuit 250 further condition the first clock signal CLK1 and the second clock signal CLK2 is provided to the second regulator circuit 230. The second regulator circuit 230 includes a second phase detector 235 and a second voltage adjustor 240. Analogous to the first phase detector 210, the second phase detector 235 has a comparator window that detects a phase relationship between the second clock signal CLK2 and the data stream and provides a phase relationship signal therefrom. The second voltage adjustor 240 adjusts the second intermediate voltage signal V2 as a function of the phase relationship signal derived from the second phase detector 235.

The second intermediate voltage signal V2 further adjusts ones of the delay elements of the delay circuit 250 until a skew between the transitions of the data stream and the first and second clock signals CLK1, CLK2 are reduced. At a point wherein the transitions are about the same, a delay between the first and second clock signals CLK1, CLK2 equals about a length of one bit cell. Caution should be followed to avoid a delay that equals n bit cells, wherein n>1. This may be accomplished by using an initialization circuit for the DRAM that resets the delay elements of the delay circuit 250 to a very small delay during an initialization of the clock recovery circuit 110. Also, each feedback loop that encompasses the first and second regulator circuits 210, 230 should have different time constants to avoid a ringing waveform within the clock recovery circuit 110. For instance, a smaller time constant for the first regulator circuit 210 is preferable, such that, the first intermediate voltage signal V1 settles before a second edge thereof is adjusted with the second intermediate voltage signal V2.

A data latch 280 associated with the clock recovery circuit 110, latches the data from the data stream as a function of a strobe signal SRB that is generated as a function of the first and second intermediate voltage signals V1, V2. More particularly, the strobe signal SRB is derived from a tap between the third and fourth delay elements 265, 270 of the delay circuit 250. Thus, as the first and second clock signals CLK1, CLK2 are both adjusted to transition substantially concurrently with the data, the tap between the third and fourth delay elements 265, 270 provides the strobe signal SRB that is preferably centered in the data eye.

Thus, the clock recovery circuit 110 provides a technique that allows an operation thereof with a single system clock. The strobe signal SRB is locally generated from the data stream, making separate strobe pins as well as a strobe clock tree and matching delays in a data path generally superfluous and thereby perceptibly reducing a clock current. Instead of using an external strobe signal, the system clock signal SCLK is employed that generally operates at about the same frequency of the derived strobe signal SRB. The strobe signal SRB is derived employing a variable delay as determined in accordance with the delay circuit 250 of the clock recovery circuit 110. The amount of delay should be adjusted so that the transitions occur in a middle of a bit cell. The first and second regulator circuits 210, 230 adjust ones of the plurality of delay elements of the delay circuit 250 to obtain the variable delay.

The clock recovery circuit 110, according to the principles of the present invention, generally overcomes a need for matching delays in the data path of the DRAM as well as trim elements, thereby reducing a current consumption and simplifying a design configuration of the DRAM. Obviously, supplanting a need for delay elements in the data path speeds up a transmission of the data stream within the DRAM. Another advantageous aspect is that a strobe time is determined by averaging the occurrences of the data transitions over time.

The techniques described herein take into account that the data buffer might demonstrate a different behavior when receiving a clocked signal compared to a random data stream. When a data buffer operates in a frequency range close to a gain bandwidth, the clocked signal (looking at the transitions at a high frequency) might result in smaller voltage swings for signals within the data buffer. As a result, the data buffer might switch faster compared to transitions in the data stream that may occur with lower frequencies. Therefore, the strobe signal may not be centered in the data eye, but be skewed in one direction. This limitation is avoided in conjunction with the clock recovery circuit 110 constructed according to principles of the present invention because the strobe signal SRB is generated out of the data stream.

Again, the first and second regulator circuits 210, 230 are searching for data transitions to adjust the strobe signal SRB. Looking at a conventional operation of a DRAM, however, one data pin might receive the same data polarity for an extended period of time (e.g., hours) without switching. In order to better operate the clock recovery circuit 110 according to the present invention, it is preferable to ensure that data transitions occur with a certain pre-selected period of time. This may be performed for DRAMS having ports that multiplex data and commands (e.g., packet type buses) by, for instance, decoding the commands in a fashion that transitions occur on every line whenever the device is operated with a useful sequence of commands. Otherwise, dummy cycles may be incorporated during which the data pins are toggled. For certain applications, dummy cycles may be hidden behind other commands. For a DRAM, for example, the data pins may be toggled by the controller following a refresh cycle without losing any data bandwidth because data is not received during the refresh period in any event. The refresh period, therefore, may be employed to supply dummy transitions for calibration of the strobe signals SRB of the clock recovery circuit 110.

Looking at an individual pin basis, the strobe signals SRB may be generated on a pin individual basis, which means that the strobe signal SRB may be slightly offset depending on a structure of a data pattern received by the individual pins. Obviously, the data should be synchronized prior to further processing, which may be accomplished by employing a first-in first-out data buffer configuration. While the individual strobe signals SRB are used to write the data into the first-in first-out data buffer structure, the system clock is employed for the read out function. The read out pulses should therefore be delayed long enough versus the write pulses so that little or no data contention occurs.

Figure 3B:
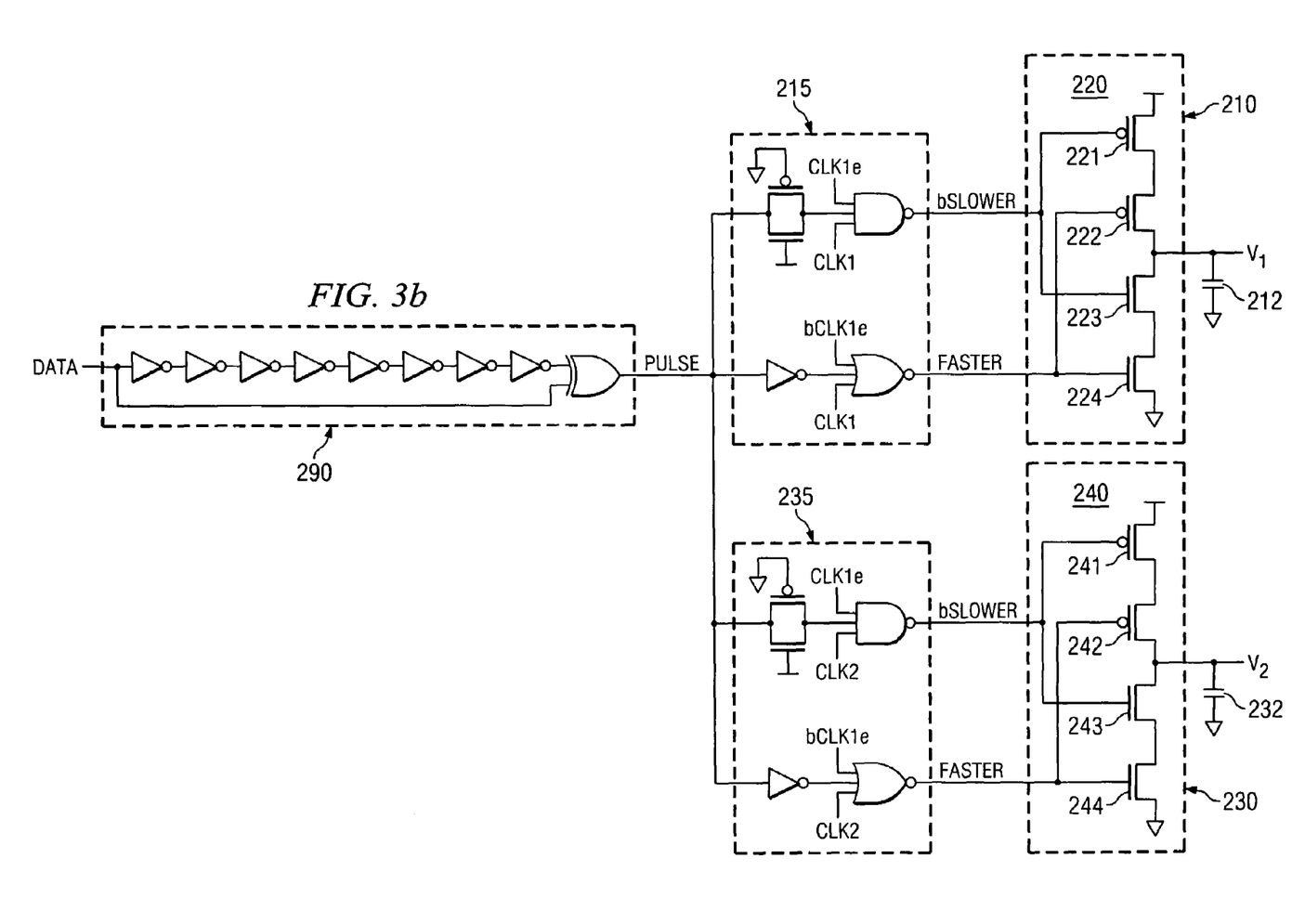

FIGS. 3a and 3b, collectively referred to as FIG. 3, provide a specific example of one implementation of the present invention. In particular, this embodiment provides an analog implementation of a strobe-generator as described herein. This circuit is meant as an example only and the present invention is not limited to the described solution.

The following is a short description of the functionality of the circuit of FIG. 3. Referring first to FIG. 3a, three sequential variable delay-chains 255/260, 265 and 270 receive the system clock SCLK and are used to generate the internal clocks CLK1, CLK2 and SRB, which were described above with respect to FIG. 2. In this particular example, each delay chain includes a number of serially coupled inverters. The output of each inverter is coupled to a capacitance via a selection-transistor. Varying the gate-voltage of these selection-transistors changes the effective load seen by the inverters in the delay-chain and thus varies the delay. The gate voltages for and, therefore, the delay of the first inverter chain 255/260 is controlled by the voltage V1 while the gate voltages for and, therefore the delay of the second and third chains are controlled by the voltage V2. Enable clock signals CLK1e and bCLK1e are also generated and will be used to generate the control voltages V1 and V2 as discussed below.

Referring now to FIG. 3b, a pulse-generator 290 generates a pulse with a fixed width for each transition in the incoming data-stream DATA. The width of the pulse is determined the delay of the string of inverters within pulse-generator 290. The output of the pulse-generator 290, which is labeled "pulse," is used as input for two separate phase-detectors 215 and 235. In phase-detector 215, the pulse is compared to CLK1, which has been tapped off after the delay-chain 255/260 and delayed by one-half of a pulse-width by the delay circuit 292, as shown in FIG. 3a. In the phase detector 235, the pulse is compared to CLK2, which has been tapped off after the delay-chain 290 and delayed by one half of a pulse-width by the delay circuit 294.

The two phase detectors 215 and 235 have additional enable-inputs which are coupled to complementary clock signals CLK1e and bCLK1e, which were generated in FIG. 3a as shown. As an example, this feature is useful for a double data rate type of application. For instance, this feature ensures that the detector 215 synchronizes on even data edges and the detector 235 synchronizes on odd data edges. In other words, the delay between CLK1 and CLK2 is 180 degrees. The phase-relationships between this enable clock CLK1e and the clock signals CLK1 and CLK2 are arbitrary.

The phase-detector 215 (or 235) decodes a signal bSLOWER that is active for the duration of the overlap of the data pulse PULSE being high and the input-clock CLK1 (or CLK2) being high and a signal FASTER that is active for the duration of the overlap of the data-pulse being high and the input-clock CLK1 (or CLK2) being low. In the voltage-regulator 220 (or 230), the signal bSLOWER opens a p-channel transistor 221 (or 241) that slowly charges a large capacitor 212 (or 232) to VDD while the signal FASTER opens an n-channel transistor 224 (or 244) that discharges the same capacitor 212 (or 232) to ground. The capacitor 212 charged by the first phase-detector 215 provides the voltage-reference V1, while the capacitor 232 charged by the second phase-detector 235 provides the voltage-reference V2. The feedback-loops reach a stable state when the input-clocks CLK1 and CLK2 cut the pulses generated by data-switching in half. This means that the bSLOWER and FASTER pulses created with each data-switching have exactly the same width, causing a small discharge followed by a small charge of the same amount.

Since the phase-detectors 215 and 235 are active during complementary clock-phases, the phase difference between CLK1 and CLK2 is 180 degrees. The strobe signal SRB is tapped off the inverter chain of FIG. 3b at a point in the middle between CLK1 and CLK2 minus one half of the pulse-generator delay. There is no matching delay in the tap for the strobe signal SRB. In this manner, the strobe signal SRB can be 90 degrees delayed from the incoming-data (middle of the data-eye of a double data-rate type data-stream). The concept of using pulses when data transitions means that periods where no data changes are automatically ignored and only valid edges will be evaluated.

The schematic shown in FIG. 3 does not contain any start-up circuitry that would force the circuit into a valid power-on state. Additional filtering can be added that allow the circuit to regulate more quickly during the initial search and then switch to a slower mode once it found a stable operating point.

Figure 4A:
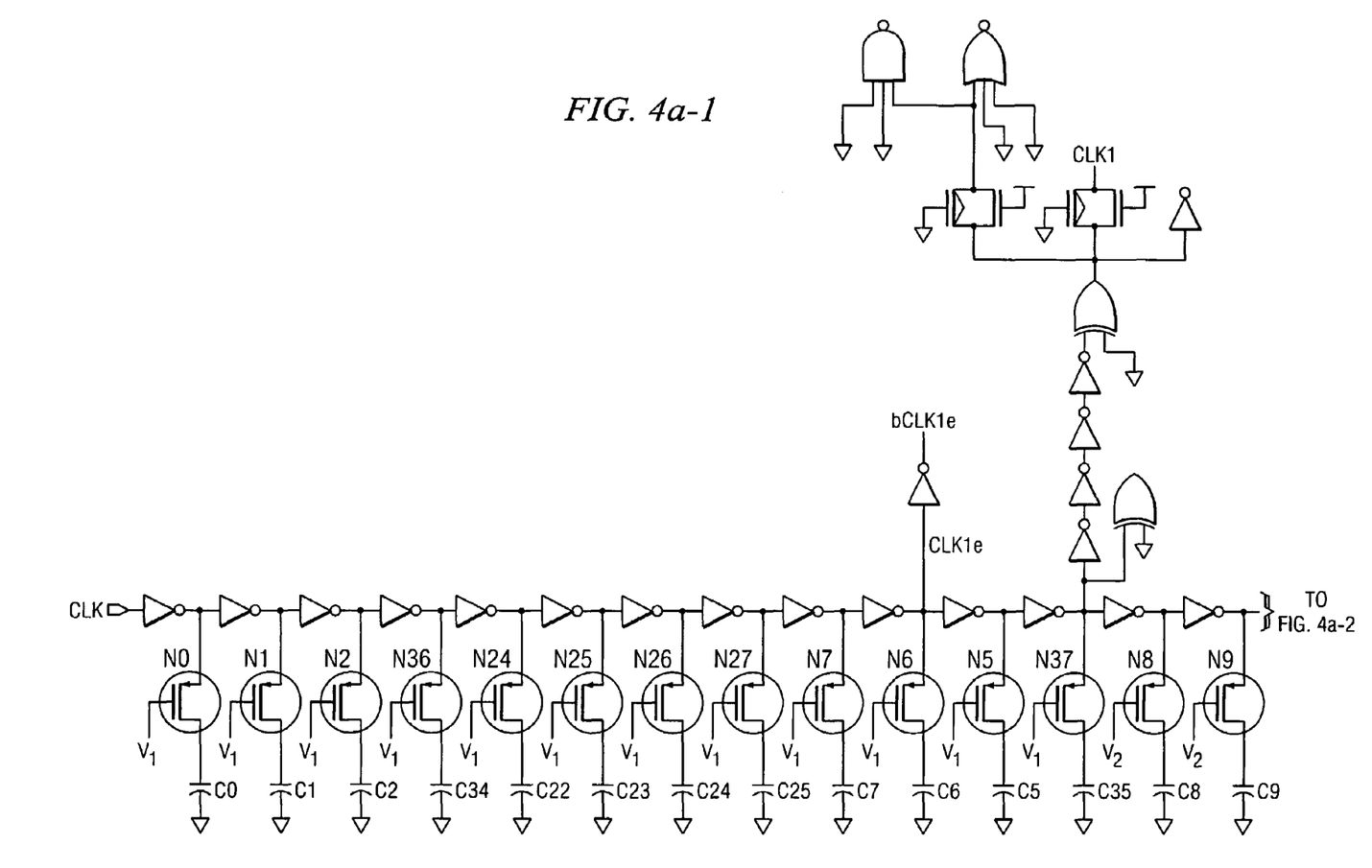
FIGS. 4a and 4b illustrate a more detailed schematic of the embodiment of FIGS. 3a and 3b.
Figure 4A:
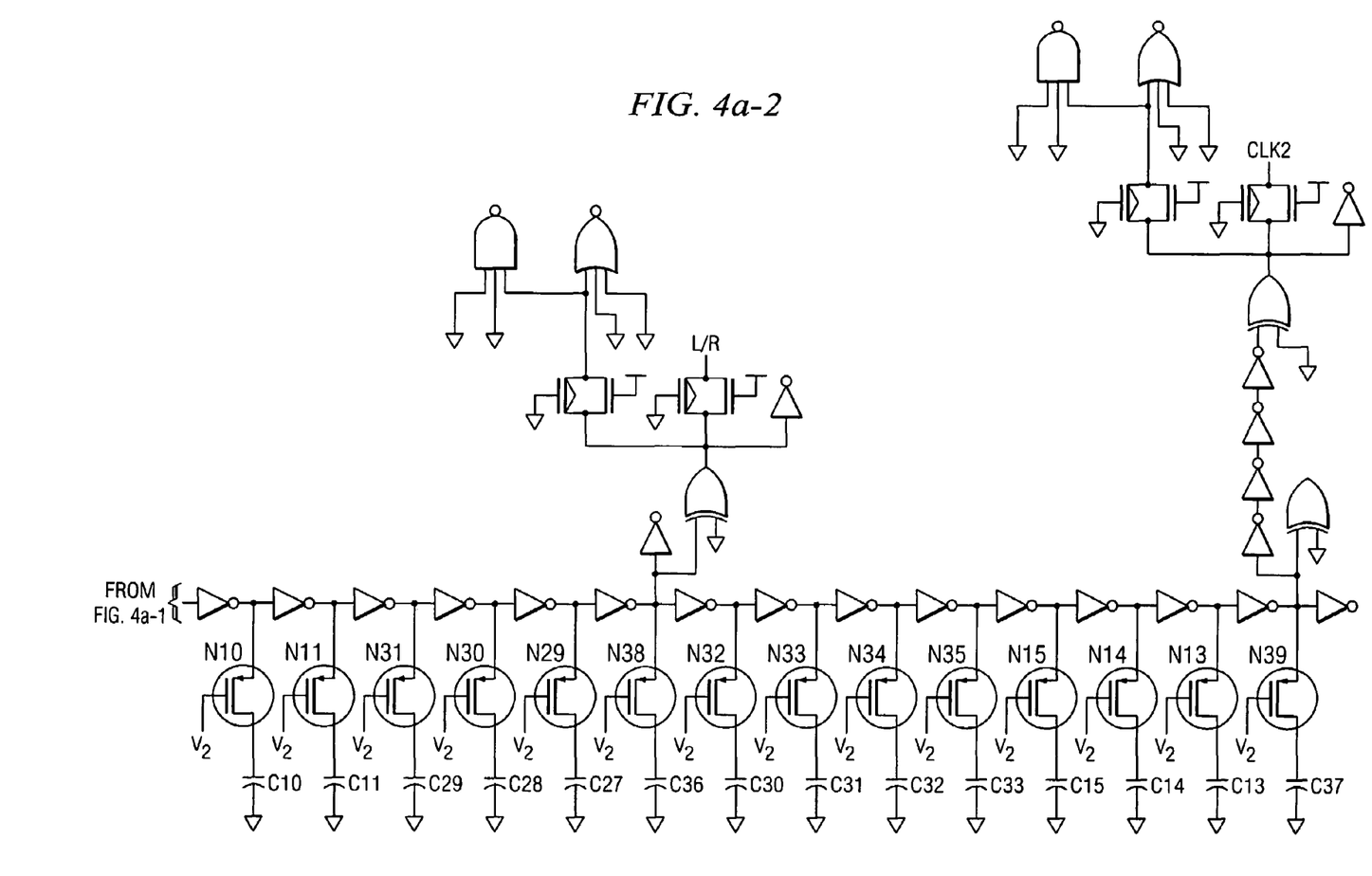
Figure 4B:
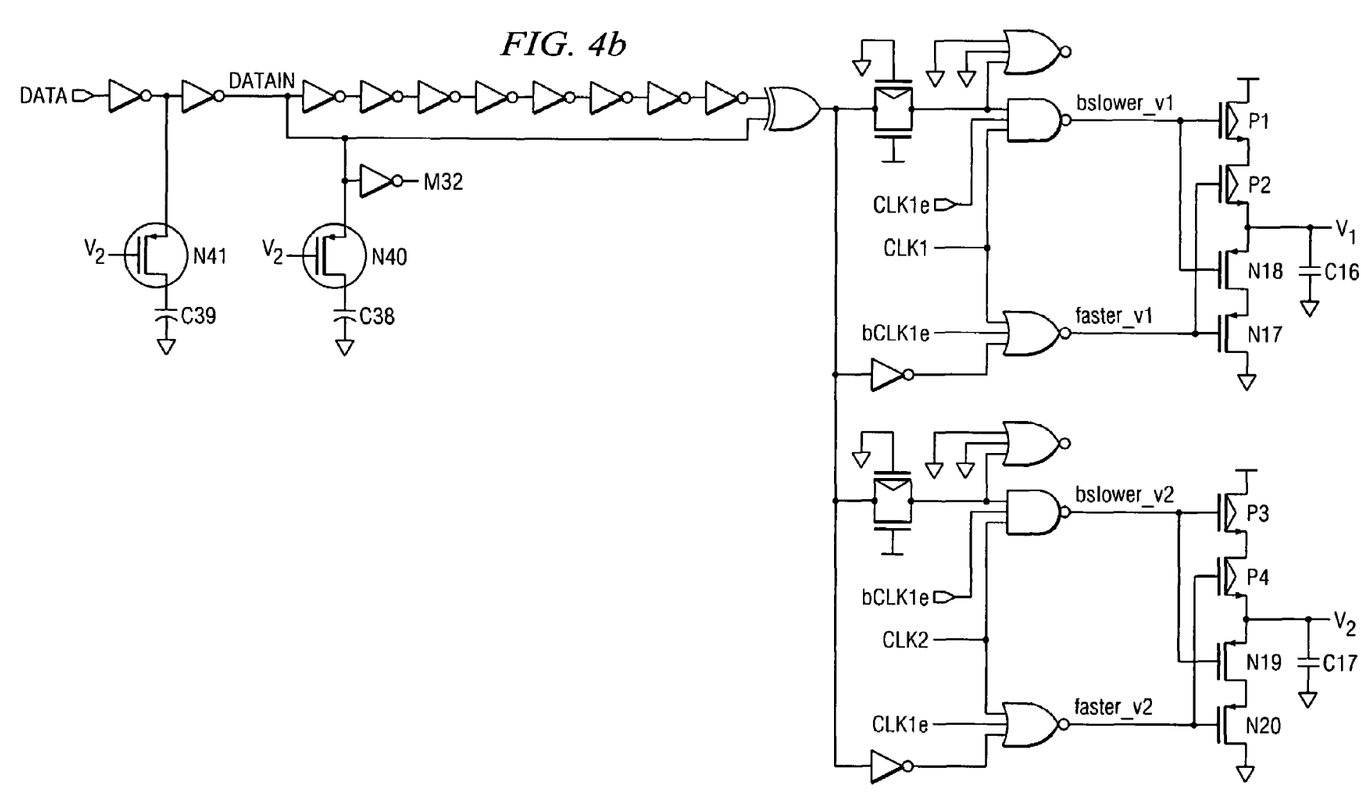

FIGS. 4a and 4b illustrate a more detailed schematic of the implementation of FIG. 3. This circuit includes the circuitry of FIG. 3 as well as additional circuitry, e.g., for load matching. Given the similarities of the two circuits, further discussion is not deemed necessary.

Other implementations of the concepts described herein are possible and should not be excluded. For example, the circuits can utilize digital voltage regulation, e.g., using a counter and a binary-decoded voltage-divider. Different phase-detectors can also be implemented. For example, a latch-based arbitration-circuit that evaluates the relative timing and then increments or decrements above-mentioned counter can be used.

Figure 5:
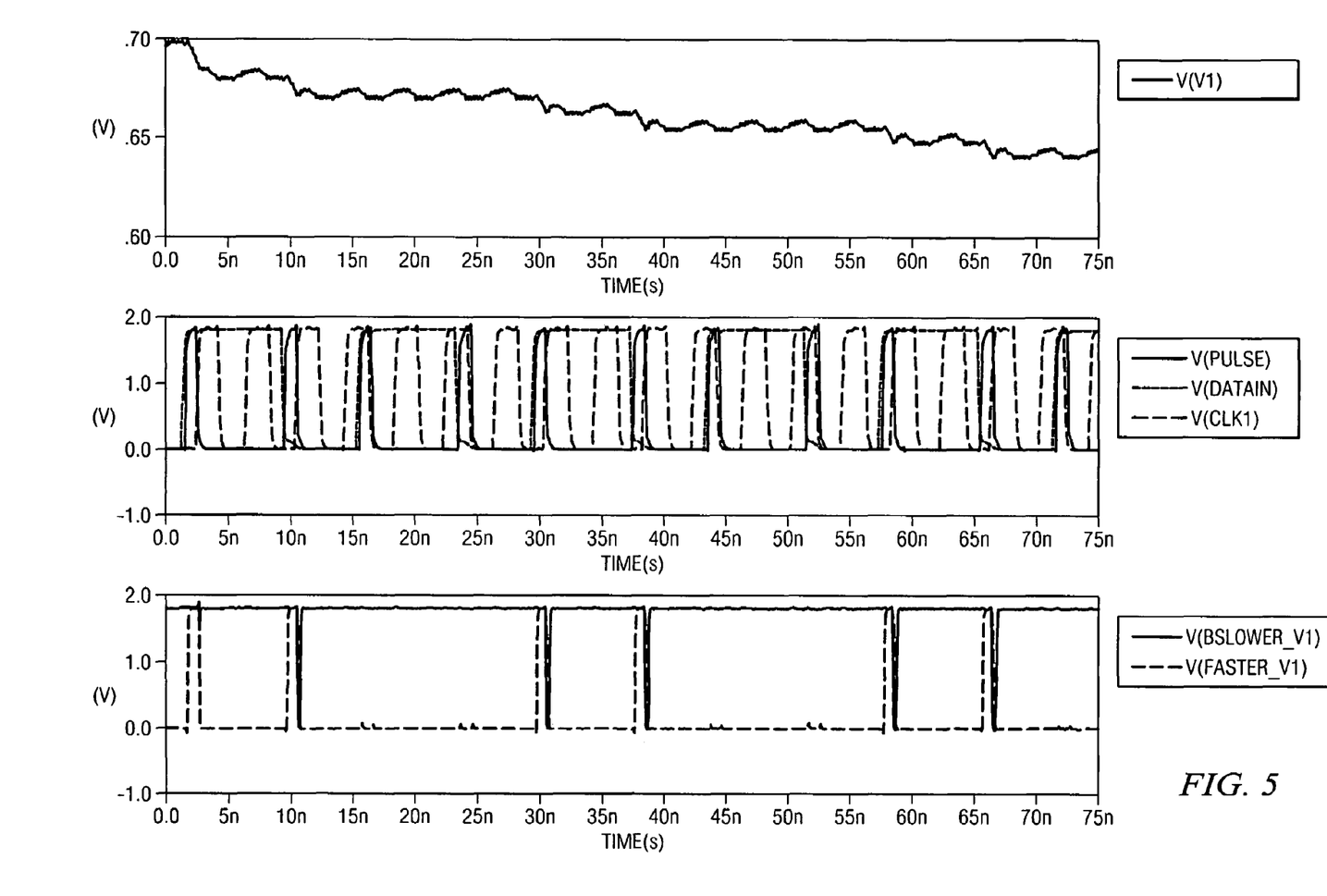
FIGS. 5 and 6 illustrate waveform diagrams demonstrating an operation of the clock synchronizing clock signals in an electronic device in accordance with the principles of the present invention.
Figure 6:
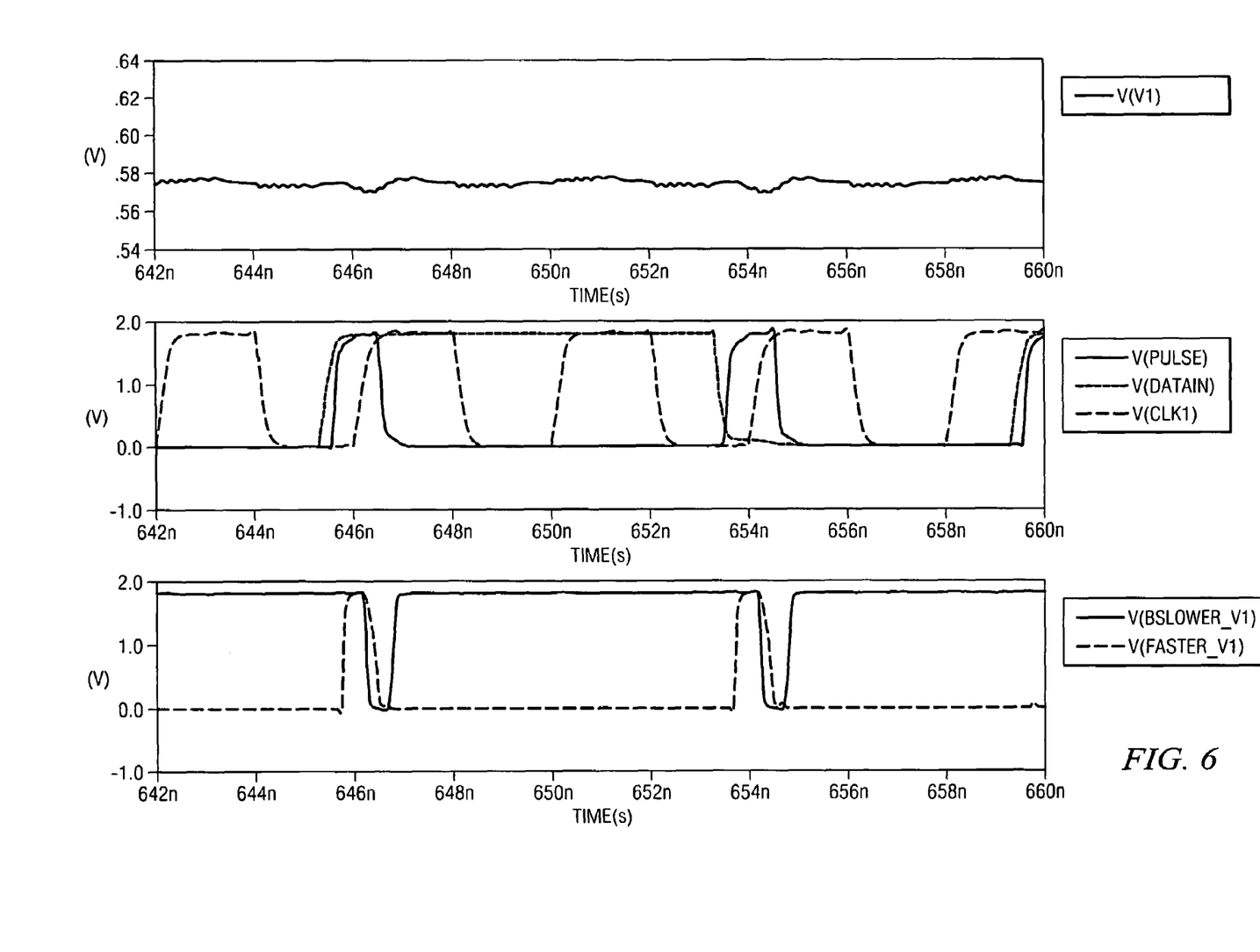

Turning now to FIGS. 5 and 6, waveform diagrams are provided to demonstrate an operation of synchronizing clock signals in an electronic device in accordance with principles of the present invention.

Referring first to FIG. 5, the upper most waveform illustrates a voltage V1, which is the analog voltage being regulated by the voltage regulator. A similar figure would apply to voltage V2. A period is shown where the regulator is still searching for the equilibrium and the voltage V1 is regulated lower. The middle waveform shows the signals CLK1, DATA and PULSE. It can be seen that the rising edge of CLK1 is slowly moved towards the center of the pulses PULSE.

Finally, the lower waveform shows the signals bSLOWER and FASTER. Initially, only the signal FASTER is created (CLK1 rising occurs outside the pulse PULSE). As V1 is lowered, the delay in the first chain gets smaller thereby moving the signal CLK1 back into the signal PULSE. As a result, both signals FASTER and bSLOWER are generated and have widths that vary depending on where the signal CLK1 rising-edge dissects the signal PULSE.

Since the signal V1 is lowered while the signal FASTER is active and increased while the signal bSLOWER is active, the slope of V1 decreases over time and reaches its equilibrium once the FASTER and bSLOWER-pulses have the same width. This is shown in the second waveform-plot on FIG. 6.

Thus, a clock recovery circuit has been introduced that locally generates strobe signals for data strobing on high bandwidth data ports. The clock recovery circuit takes advantage of an existing system clock that typically operates at about the same frequency as the strobe signal. Consequently, another clock is not necessary as generated by a phase lock loop, for instance, but the system clock can be conditioned (e.g., delayed) and used to provide the strobe signals. Especially for DRAM applications, the principles of the present invention are quite beneficial as the data ports are usually spread out across the memory chip and the inherent device speed is relatively slow, making it necessary with currently available clock recovery techniques to design elaborate balanced clock trees and corresponding matching delays, which consume a significant percentage of the memory chip current.

Thus, a clock recovery circuit, method of providing a strobe signal for an electronic device, and memory device employing the circuit and method with readily attainable and quantifiable advantages has been introduced. The clock recovery circuit and related method according to the principles of the present invention not only provide synchronism between the various systems of the electronic device, but achieve the result in a cost effective manner employing an efficient circuit design. Those skilled in the art should understand that the previously described embodiments of the clock recovery circuit and related method for synchronizing clock signals in an electronic device are submitted for illustrative purposes only and that other embodiments capable of synchronizing clock signals in accordance with deriving a strobe signal from a data stream are well within the broad scope of the present invention.

Also, although the present invention and its advantages have been described in detail, it should be understood that various changes, substitutions and alterations can be made herein without departing from the spirit and scope of the invention as defined by the appended claims.

What is claimed is:

1. An electronic circuit comprising:
   an external signal input for carrying a non-periodic information signal;
   a clock node for carrying an internal system clock;
   a clock recovery circuit with a first input coupled to the external signal input and a second input coupled to the clock node, the clock recovery circuit including an output node carrying a strobe signal; and
   a latch circuit with a first input coupled to the external signal input and a second input coupled to the output node of the clock recovery circuit, wherein the non-periodic information signal is latched into the latch circuit in response to the strobe signal;
   wherein the clock recovery circuit comprises:
      a delay circuit that includes the second input of the clock recovery circuit and the output node of the clock recovery circuit, the delay circuit further including a first clock output and a second clock output and also further including a first control input and a second control input;
      a first regulator circuit with a first input coupled to the first clock output of the delay circuit and a second input coupled to the external signal input, the first regulator circuit having an output coupled to the first control input of the delay circuit; and
      a second regulator circuit with a first input coupled to the second clock output of the delay circuit and a second input coupled to the external signal input, the second regulator circuit having an output coupled to the second control input of the delay circuit.

2. The electronic circuit of claim 1, wherein the external signal input comprises a data input for carrying a data stream and wherein the latch circuit comprises a data latch.

3. The electronic circuit of claim 1, wherein the electronic circuit is integrated on a semiconductor substrate comprising an external input node coupled to the external signal input, the external input node being directly connectable to an element outside of a substrate of the semiconductor chip.

4. A dynamic random access memory device comprising:
a memory array including a plurality of memory cells, each memory cell including a capacitor coupled to a transistor;
a data buffer configured to provide data to and receive data from said memory array, the data buffer coupled to an external node that carries a data signal from a source external of the memory device;
a clock receiver node configured to receive a system clock signal from a source external of the memory device; and
a clock recovery circuit, including:
a delay circuit having an input coupled to the clock receiver node, the delay circuit having a first output carrying a first clock signal and a second output carrying a second clock signal;
a first regulator circuit configured to compare the first clock signal to the data signal, the first regulator circuit including an output node to carry a first intermediate signal, the output node of the first regulator circuit being coupled to the delay circuit;
a second regulator circuit configured to compare the second clock signal to said data signal, the second regulator circuit including an output node to carry a second intermediate signal, the output node of the second regulator circuit being coupled to the delay circuit; and
a strobe signal node coupled between the delay circuit and the data buffer.

5. The device as recited in claim 4, wherein the delay circuit comprises:
a first delay element having an input node and an output node wherein the input node is coupled to the clock receiver node and the output node comprises the first output of the delay circuit;
a second delay element having an input node and an output node wherein the input node is coupled to the output node of the first delay element and the output node comprises the strobe signal node; and
a third delay element having an input node and an output node wherein the input node is coupled to the output node of the second delay element and the output node comprises the second output of the delay circuit.

6. The device as recited in claim 4, wherein said first regulator circuit comprises:
a phase detector configured to detect a phase relationship between the first clock signal and said data and provide a phase relationship signal therefrom; and
a voltage adjustor coupled to receive the phase relationship signal from the phase detector, the voltage adjustor having an output that carries said first intermediate signal, wherein the first intermediate signal is related to the phase relationship signal.

7. The device as recited in claim 6, wherein said second regulator circuit comprises:
a second phase detector configured to detect a phase relationship between said second clock signal and said data and provide a second phase relationship signal therefrom; and
a second voltage adjustor coupled to receive the second phase relationship signal from the second phase detector of the second regulator circuit, the second voltage adjustor having an output that carries said second intermediate signal, wherein the second intermediate signal is related to the second phase relationship signal.

8. A circuit comprising:
a first variable delay element having an input node to receive a clock signal;
a second variable delay element having an input coupled to an output of the first variable delay element;
a third variable delay element having an input coupled to an output of the second variable delay element;
a first phase detector with a first input coupled to a data signal node and a second input coupled to the output of the first variable delay element, the data signal node carrying a stream of data signals;
a first voltage adjustor with an input coupled to an output of the first phase detector, the first voltage adjustor having an output coupled to a control input of the first variable delay element;
a second phase detector with a first input coupled to the data signal node and a second input coupled to the output of the third variable delay element; and
a second voltage adjustor with an input coupled to an output of the second phase detector, the second voltage adjustor having an output coupled to a control input of the second variable delay element and also to a control input of the third variable delay element.

9. The circuit of claim 8, further comprising a data latch with a data input node coupled to the data signal node and a data strobe node coupled to the output of the second variable delay element.

10. The circuit of claim 8, further comprising a pulse generator with an output coupled to the data signal node.

* * * * *